United States Patent
Izawa

(10) Patent No.: US 10,613,148 B2
(45) Date of Patent: *Apr. 7, 2020

(54) BATTERY MONITORING SYSTEM

(71) Applicant: YAZAKI CORPORATION, Tokyo (JP)

(72) Inventor: Takaaki Izawa, Shizuoka (JP)

(73) Assignee: YAZAKI CORPORATION, Minato-ku, Tokyo (JP)

( * ) Notice: Subject to any disclaimer, the term of this patent is extended or adjusted under 35 U.S.C. 154(b) by 0 days.

This patent is subject to a terminal disclaimer.

(21) Appl. No.: 15/635,378

(22) Filed: Jun. 28, 2017

(65) Prior Publication Data

US 2018/0024201 A1 Jan. 25, 2018

(30) Foreign Application Priority Data

Jul. 21, 2016 (JP) ................................ 2016-143139

(51) Int. Cl.
*G01R 31/36* (2020.01)
*G01R 31/367* (2019.01)
(Continued)

(52) U.S. Cl.
CPC .......... *G01R 31/367* (2019.01); *B60L 3/0046* (2013.01); *B60L 3/12* (2013.01);
(Continued)

(58) Field of Classification Search
CPC .......... G01R 31/3658; G01R 19/16542; G01R 31/3648; H02J 7/0021; Y02E 60/12
See application file for complete search history.

(56) References Cited

U.S. PATENT DOCUMENTS 8,723,527 B2 5/2014 Kudo et al.
8,922,169 B2 12/2014 Sugimura
(Continued)

FOREIGN PATENT DOCUMENTS

CN 102593886 A 7/2012
CN 105128677 A 12/2015
(Continued)

OTHER PUBLICATIONS

Communication dated Oct. 2, 2018 issued by the Japanese Patent Office in counterpart Application No. 2016-143139.

*Primary Examiner* — Jermele M Hollington
*Assistant Examiner* — Suresh K Rajaputra
(74) *Attorney, Agent, or Firm* — Sughrue Mion, PLLC

(57) ABSTRACT

A battery monitoring system includes a multiplexer, a self-diagnosis voltage generation circuit, a first voltage measuring circuit and a voltage measuring circuit which measure voltage signals in a first route and a second route inputted through the multiplexer, based on the self-diagnosis voltage generated from the self-diagnosis voltage generation circuit or based on the voltages of battery cells outputted from the input circuit, a comparator which compares measurement results of the first and second voltage measuring circuits, and a control unit which judges the presence/absence of a failure in a measuring route connected to the first voltage measuring circuit or the second voltage measuring circuit and the presence/absence of a failure of the first voltage measuring circuit itself or the second voltage measuring circuit itself, based on a comparison result by the comparator and which controls the input circuit, the multiplexer, the comparator, and the self-diagnosis voltage generation circuit.

6 Claims, 3 Drawing Sheets

(51) Int. Cl.
  *G01R 31/396* (2019.01)
  *G01R 31/3835* (2019.01)
  *G01R 35/00* (2006.01)
  *B60L 3/00* (2019.01)
  *B60L 3/12* (2006.01)
  *B60L 58/10* (2019.01)

(52) U.S. Cl.
  CPC .......... *B60L 58/10* (2019.02); *G01R 31/3835* (2019.01); *G01R 31/396* (2019.01); *G01R 35/00* (2013.01); *B60L 2240/547* (2013.01); *Y02T 10/7005* (2013.01); *Y02T 10/705* (2013.01)

(56) References Cited

U.S. PATENT DOCUMENTS

| | | |
|---|---|---|
| 9,404,975 B2 | 8/2016 | Kudo et al. |
| 10,202,041 B2 | 2/2019 | Kudo et al. |
| 2010/0244847 A1 | 9/2010 | Kudo et al. |
| 2012/0025769 A1* | 2/2012 | Kikuchi ................ B60L 3/0046 320/118 |
| 2012/0176160 A1 | 7/2012 | Sugimura |
| 2013/0278218 A1* | 10/2013 | Onnerud ............. H01M 10/441 320/118 |
| 2014/0159739 A1 | 6/2014 | Kudo et al. |
| 2015/0054519 A1 | 2/2015 | Tomonaga et al. |
| 2016/0131717 A1* | 5/2016 | Sugimura .............. G01R 35/00 |
| 2016/0303977 A1 | 10/2016 | Kudo et al. |
| 2017/0184678 A1 | 6/2017 | Sekiguchi et al. |
| 2018/0024198 A1* | 1/2018 | Izawa ................... G01R 31/36 320/132 |

FOREIGN PATENT DOCUMENTS

| | | |
|---|---|---|
| JP | 2002-168928 A | 6/2002 |
| JP | 2010-249793 A | 11/2010 |
| JP | 2013-24800 A | 2/2013 |
| JP | 2014-240818 A | 12/2014 |
| JP | 2015-62006 A | 4/2015 |
| JP | 5712841 B2 | 5/2015 |
| JP | 2017-120221 A | 7/2017 |
| JP | 2018-13414 A | 1/2018 |

* cited by examiner

BATTERY MONITORING SYSTEM

CROSS REFERENCE TO REBATED APPLICATION

The present application is based on, and claims priority from Japanese Patent Application No. 2016-143139, filed Jul. 21, 2016, the disclosure of which is hereby incorporated by reference herein in its entirety.

TECHNICAL FIELD

The present application relates to a battery monitoring system for monitoring the states of battery cells constituting a battery pack.

BACKGROUND ART

In a hybrid vehicle, an electric vehicle, or the like, a driving power is obtained since a motor is driven by electric power accumulated in a secondary battery such as a lithium ion battery or a nickel hydrogen battery.

In such a secondary battery, for example, a plurality of battery cells is mutually connected in series, thereby forming a battery pack.

With charge to and discharge from respective battery cells performed repeatedly, the battery pack gradually deteriorates over time and additionally, the output voltage of each battery cell changes.

Also, in the battery pack, the output voltage of each battery cell also changes due to a load variation, such as a change in the running state of a vehicle, or a disturbance such as a change in temperature or humidity.

In a case of the battery pack using lithium ion batteries, particularly, it is necessary to monitor the voltage and the like of each battery cell accurately to suppress overcharging to and overdischarging from each battery cell and therefore, techniques related to battery monitoring have been proposed (see PTL1 (JP 2013-024800 A)).

As illustrated in FIG. 3, a voltage detection device 520 of a conventional example described in PTL1 includes multiplexers 540, 541 that selectively connect any one of respective battery cells 511 of a battery pack 510 where the battery cell 511 is connected in series, and a plurality of voltage detection means 550, 551 for detecting the cell voltages as the output voltages of the multiplexers 540, 541.

Additionally, the voltage detection device 520 includes switching means 530 for switching the operation between a first mode where the respective voltage detection means 550, 551 detect the cell voltages of different battery cells 511 and a second mode where the respective voltage detection means 550, 551 detect the cell voltage of an identical battery cell 511.

With the voltage detection device 520 having such a configuration, by providing two measuring routes (the voltage detection means 550, 551, etc.) to measure an identical objective voltage respectively, if there is a difference between respective measurement results by the voltage detection means 550, 551, it is judged that any failure has arisen in either one or both of the measuring routes.

SUMMARY

However, the voltage detection device of the conventional example has the following disadvantages.

That is, there is a case where it is judged that the measuring routes have no anomaly from a situation where the same measurement result is outputted even when both of the measuring route could not measure the voltages correctly. Therefore, the conventional voltage detection device has a problem that the reliability in detecting a failure is low.

Additionally, for a situation where both of two measuring routes output the same measurement result and are out of order, it is expected that a power supply or the like used in both measuring routes in common may have a failure. Nevertheless, as the voltage detection device of the conventional example cannot detect such a failure, it is unlikely that one can take a measure of suspending the use of a battery pack as an object to be monitored and stopping an apparatus such as a vehicle mounting the battery pack, thereby raising a problem of inferior function safety of the whole system.

In consideration of the above-mentioned problems to be solved, an object of the present application is to provide a battery monitoring system capable of improving the reliability in detecting a failure and enhancing the function safety of the whole system. Another object of the present application is to provide, if a failure occurrence is limited to one of the voltage measuring routes, a battery monitoring system that also makes it possible to continue the function of the whole system with the use of only the other voltage measuring route having no failure.

According to an aspect of the present application, there is provided a battery monitoring system for monitoring a state of a battery pack including n (n: an integer) pieces of battery cells connected in series over a plurality of stages, including: an input circuit to which respective voltage signals of the battery cells are inputted; a multiplexer configured to select a battery cell for voltage detection from the n pieces of battery cells, select voltage signals inputted from the input circuit, and output the selected voltage signals; a self-diagnosis voltage generation circuit configured to generate a self-diagnosis voltage for diagnosing a failure status of the battery monitoring system itself; a first voltage measuring circuit configured to measure a voltage signal in a first route inputted through the multiplexer, based on the self-diagnosis voltage generated from the self-diagnosis voltage generation circuit or based on the voltages of the battery cells inputted from the input circuit; a second voltage measuring circuit configured to measure a voltage signal in a second route inputted through the multiplexer at the same time when the first voltage measuring circuit measures the voltage signal in the first route, based on the self-diagnosis voltage generated from the self-diagnosis voltage generation circuit or based on the voltages of the battery cells inputted from the input circuit; a comparator configured to compare a measurement result by the first voltage measuring circuit with a measurement result by the second voltage measuring circuit; and a control unit configured to judge a presence or absence of a failure in a measuring route connected to the first voltage measuring circuit or the second voltage measuring circuit and a failure of the first voltage measuring circuit itself or the second voltage measuring circuit itself, based on a comparison result by the comparator, and control the input circuit, the multiplexer, the comparator, and the self-diagnosis voltage generation circuit.

The input circuit may include: n pieces of FETs constituting equalization switches for equalizing the voltages of the respective battery cells; n pieces of resistors for equalization, each of which is connected between a drain terminal side of each of the FETs and a positive side of each of the battery cells; n pieces of first monitor terminals, each of which is connected to a connection point between each of the resistors and the positive side of each of the battery cells and to which the voltage signals in the first route are inputted; and n pieces of second monitor terminals, each of which is connected to a connection point between the drain terminal side of each of the FETs and each of the resistors and to which the voltage signals in the second route are inputted. A first switch group may be interposed between the input circuit and the multiplexer to shut-off the voltages of the battery cells inputted from the input circuit when selectively connecting the self-diagnosis voltage generation circuit with the routes of the first monitor terminals and the routes of the second monitor terminals.

The self-diagnosis voltage generation circuit may include a self-diagnosis voltage output unit configured to output one of different self-diagnosis voltages with every stages, to the route of the first monitor terminal and the route of the second monitor terminal both belonging to the same stage.

A second switch group may be interposed between the self-diagnosis voltage generation circuit and the first switch group. The second switch group may be configured to apply the self-diagnosis voltage generated by the self-diagnosis voltage generation circuit to the first voltage measuring circuit or the second voltage measuring circuit selectively.

A third switch group may be interposed between the self-diagnosis voltage generation circuit and the second switch group. The third switch group may be configured to cut off an application of the self-diagnosis voltage generated by the self-diagnosis voltage generation circuit forcibly.

Low pass filters are arranged on upstream sides of the first monitor terminals and the second monitor terminals, each having a same time constant.

With the aspect of the present application, it is possible to provide the battery monitoring system capable of improving the reliability in detecting a failure and enhancing the function safety of the whole system. Additionally, it is also possible to provide, if a failure occurrence is limited to one of the voltage measuring routes, the battery monitoring system capable of continuing the function of the whole system with the use of only the other voltage measuring route having no failure.

DESCRIPTION OF EMBODIMENTS

A battery monitoring system S1 according to an embodiment will be described with reference to FIGS. 1 and 2.

Figure 1:
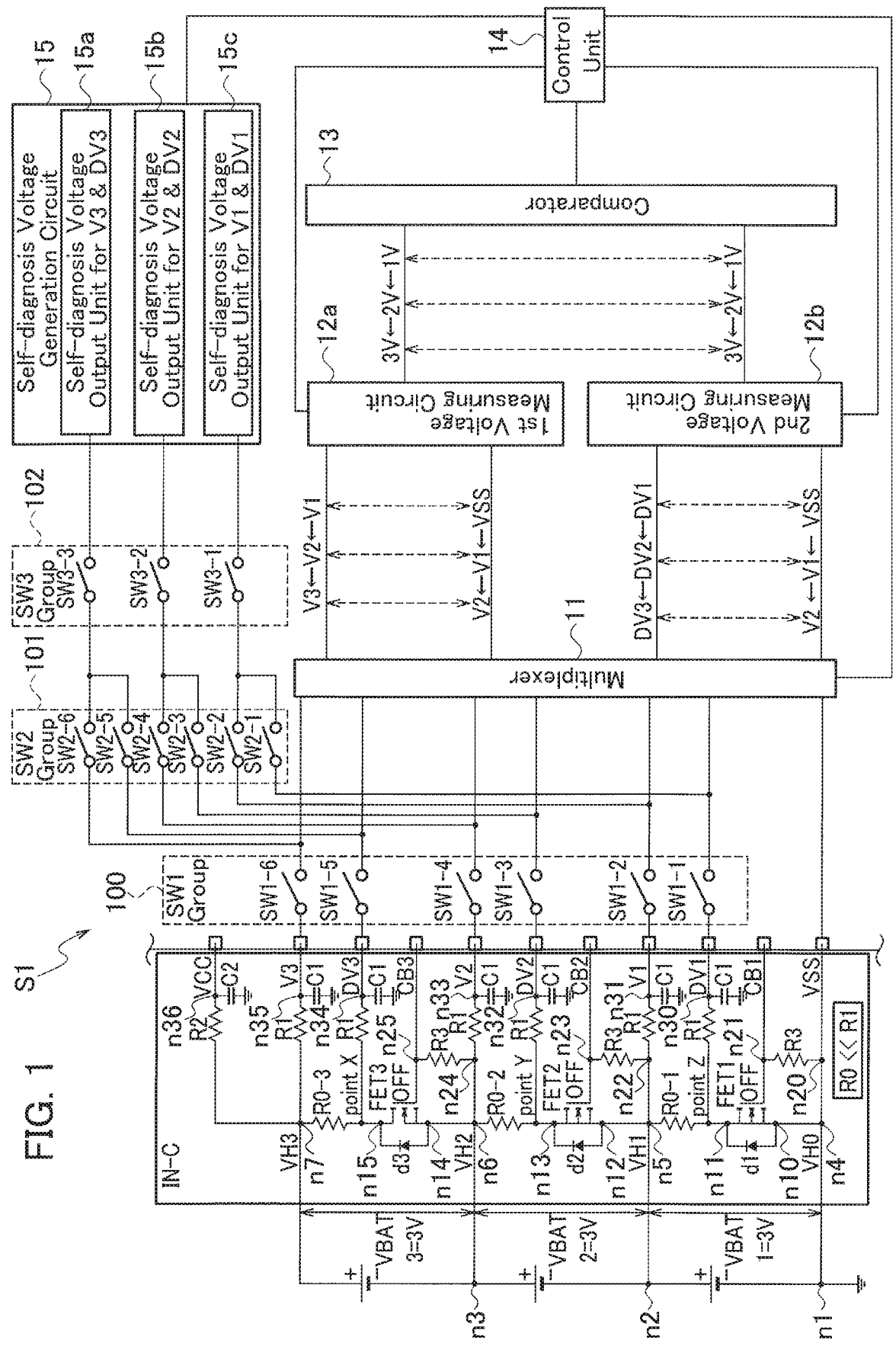
FIG. 1 is a circuit diagram illustrating an overall configuration of a battery monitoring system according to an embodiment.

As illustrated in FIG. 1, the battery monitoring system S1 is configured so as to monitor a state of a battery pack including n (n: an integer) pieces of battery cells VBATn (VBAT1 to VBAT3) connected in series by plural stages and includes an input circuit IN-C to which voltage signals of the respective battery cells VBATn are inputted, a multiplexer 11 that selects a specific battery cell VBATn, whose voltage is to be detected, out of n pieces of battery cells and also selects the inputted voltage signals for outputting them, a self-diagnosis voltage generation circuit 15 that generates a self-diagnosis voltage for diagnosing a failure status of the battery monitoring system S1 itself, a first voltage measuring circuit 12a and a second voltage measuring circuit 12b that measure voltages on the basis of voltage signals in first and second routes, which have been inputted through the multiplexer 11 based on self-diagnosis voltages outputted from the self-diagnosis voltage generation circuit 15 or voltages of the battery cells outputted from the input circuit IN-C, a comparator 13 for comparing measurement results of the first voltage measuring circuit 12a and the second voltage measuring circuit 12b with each other, and a control unit 14 constructed by a microcomputer or the like for controlling the input circuit IN-C, the multiplexer 11, the first voltage measuring circuit 12a, the second voltage measuring circuit 12b, the comparator 13, and the self-diagnosis voltage generation circuit 15. The control unit 14 outputs control signals for a first switch group 100, a second switch group 101, a third switch group 102, and FETn as equalization switches.

The control unit 14 is adapted so as to judge, based on a comparison result by the comparator 13, the presence/absence of failures of a measuring route connected to the first voltage measuring circuit 12a or the second voltage measuring circuit 12b, and the first voltage measuring circuit 12a itself or the second voltage measuring circuit 12b itself. Detailed judgment process will be described later.

The battery monitoring system S1 may be modularized and mounted on one LSI chip. Alternatively, only the input circuit IN-C or the later-mentioned first to third switch groups may be provided in the form of an LSI circuit.

Although the configuration example illustrated in FIG. 1 illustrates three battery cells VBAT1 to VBAT3 as the battery cells VBATn to be monitored for ease of explanation, they may comprise any number (n) of battery cells without being limited by this.

As illustrated in FIG. 1, schematically, the input circuit C includes FETn (n: an integer corresponding to the number of batteries) as equalization switches for equalizing the voltages of the respective battery cells VBATn, equalization resistors R0-1 to R0-3 each connected between the drain-terminal side of each FETn, and the positive side of each battery cell, n first monitor terminals Vn (V1 to V3) which are connected to connection points (nodes n5, n6, n7) between the resistors R0-1 to R0-3 and the positive sides of the respective battery cells VBATn and to which the voltages in the first route are inputted, and n second monitor terminals DVn (DV1 to DV3) which are connected to connection points X, Y, and Z between the drain-terminal sides of the respective FETn and the resistors R0-1 to R0-3 and to which the voltages in the second route are inputted.

Between the input circuit IN-C and the multiplexer 11, the first switch group (SW1 group: SW1-1 to SW1-6) 100 are arranged to perform on and off control of connection with the respective first monitor terminals Vn and the respective second monitor terminals DVn selectively.

The self-diagnosis voltage generation circuit 15 includes self-diagnosis voltage output units 15a to 15c, each of which outputs a different self-diagnosis voltage according to each stage (e.g. one of different voltages from each other by 1 to 2 V) for routes through which the first monitor terminal Vn and the second monitor terminal DVn belonging to the same stage are connected to the multiplexer 11.

In the configuration example illustrated in FIG. 1, the second switch group (SW2 group: SW2-1 to SW2-6) 101 is provided to apply the self-diagnosis voltages generated by the self-diagnosis voltage generation circuit 15 selectively.

Between the self-diagnosis voltage generation circuit 15 and the second switch group 101, the third switch group (SW3 group: SW3-1 to SW3-3) 102 is arranged to forcibly cut off the application of the self-diagnosis voltages generated by the self-diagnosis voltage generation circuit 15 under control of the control unit 14.

Consequently, even if the self-diagnosis voltages generated by the self-diagnosis voltage generation circuit 15 continue to be applied to the input circuit IN-C side (i.e. the battery cells) due to a failure of the second switch group 101, it is possible to forcibly cut off the self-diagnosis voltages by turning off the third switch group 102 under control of the control unit 14. In this way, in the battery monitoring system S1, it is contemplated to exclude a possibility that the system's function of measuring the voltages of the battery cells is influenced due to a failure of the self-diagnosis circuit system and additionally, the system's security is improved so as to avoid a collision between the cell voltage and the circuit voltage.

In the input circuit IN-C, there are low pass filters (LPFs) on the upstream side of the first monitor terminals Vn and the second monitor terminals DVn each having same time constant.

In the battery monitoring system S1, it is possible to simultaneously measure the same objective voltage by the first voltage measuring circuit 12*a* and the second voltage measuring circuit 12*b*. Additionally, it is possible to compare these measurement results with each other.

Also, since the control unit 14 controls the operations of respective switches in the first switch group 100, the second switch group 101, and the third switch group 102, it is possible to detect the presence/absence of a failure in the measuring route connected to the first voltage measuring circuit 12*a* or the second voltage measuring circuit 12*b* and a failure of the first voltage measuring circuit 12*a* itself or the second voltage measuring circuit 12*b* itself without omission.

Next, a concrete configuration example of the input circuit IN-C will be described with reference to FIG. 1.

First, on the first stage, the resistor R0-1 and the FET1 constituting an equalization switch are connected in parallel to the battery cell VBAT1 between a node n1 and a node n2, through the node n5, the point Z, a node n11, a node n10, and a node n4. A negative side of the battery cell VBAT1 is connected to the node n1, while a positive side of the battery cell VBAT1 is connected to the node n2.

A parasitic diode d1 is formed between the node n11 and the node n10.

A source terminal of the FET1 is connected to the node n10 side, while a drain terminal of the FET1 is connected to the node n11 side.

A resistor R3 is connected between the terminal VSS of a ground potential as one connection terminal with the multiplexer 11 and the drive terminal CB1 of the FET1, through a node n20 and a node n21.

The drive terminal CB1 of the FET1 is connected to a gate terminal of the FET1 through the node n21.

A resistor R1 and a capacitor C1 are connected to the first monitor terminal V1 which forms one connection terminal with the multiplexer 11 and serves to detect a cell voltage of the battery cell VBAT1, through a node 22 and a node n31.

The resistor R1 has one end connected to the positive side of the battery cell VBAT1 through the node n22, the node n5, and the node n2.

Another resistor R1 and another capacitor C1 are connected to the second monitor terminal DV1 which forms one connection terminal with the multiplexer 11 and serves to detect the drain voltage of the FET1, through a node n30.

Next, on the second stage, the resistor R0-2 and the FET2 constituting an equalization switch are connected in parallel to the battery cell VBAT2 between the node n2 and a node n3, through the node n6, the point Y, a node n12, a node n13, and the node 5. A negative side of the battery cell VBAT2 is connected to the node n2, while a positive side of the battery cell VBAT2 is connected to the node n3.

A parasitic diode d2 is formed between the node n13 and the node n12.

A source terminal of the FET2 is provided on the side of the node n12, while a drain terminal of the FET2 is provided on the side of the node n13.

A resistor R3 is connected between the first monitor terminal V1 as one connection terminal with the multiplexer 11 and the drive terminal CB2 of the FET2, through a node n22 and a node n23.

The drive terminal CB2 of the FET2 is connected to a gate terminal of FET2 through the node n23.

A resistor R1 and a capacitor C1 are connected to the first monitor terminal V2 which forms one connection terminal with the multiplexer 11 and serves to detect a cell voltage of the battery cell VBAT2, through a node n24 and a node n33.

The resistor R1 has one end connected to the positive side of the battery cell VBAT2 through a node n24, the node n6, and the node n3.

Another resistor R1 and another capacitor C1 are connected to the second monitor terminal DV2 which forms one connection terminal with the multiplexer 11 and serves to detect the drain voltage of the FET2, through a node n32.

Next, on the third stage, the resistor R0-3 and the FET3 constituting an equalization switch are connected in parallel to the battery cell VBAT3 between the node n3 and a node n7, through the node n7, the point X, a node n15, a node n14, and the node 6. A negative side of the battery cell VBAT3 is connected to the node n3, while a positive side of the battery cell VBAT3 is connected to the node n7.

A parasitic diode d3 is formed between the node n15 and the node n14.

A source terminal of the FET3 is provided on the side of the node n14, while a drain terminal of the FET3 is provided on the side of the node n15.

A resistor R3 is connected between the first monitor terminal V2 as one connection terminal with the multiplexer 11 and the drive terminal CB3 of the FET3, through a node n24 and a node n25.

The drive terminal CB3 of the FET3 is connected to a gate terminal of the FET3 through the node n25.

A resistor R1 and a capacitor C1 are connected to the first monitor terminal V3 which forms one connection terminal with the multiplexer 11 and serves to detect a cell voltage of the battery cell VBAT3, through the node n7 and a node n35.

The resistor R1 has one end connected to the positive side of the battery cell VBAT3 through the node n7.

Another resistor R1 and another capacitor C1 are connected to the second monitor terminal DV3 which forms one connection terminal with the multiplexer 11 and serves to detect the drain voltage of the FET3, through a node n34.

A resistor R2 is provided between the node n7 and a terminal VCC of a driving power supply. A capacitor C2 is connected to one end of a resistor R2 through a node n36.

Here, although each output voltage of the battery cells VBAT1 to VBAT3 is set to 3 V of rating in the illustrated embodiment, it is not limited to this.

Additionally, although the input circuit IN-C illustrated in FIG. 1 illustrates three battery cells VBAT1 to VBAT3 as the battery cells VBATn to be monitored (detected), they may comprise any number (n: an integer) of battery cells without being limited by this.

Then, according to the number (n) of battery cells VBAT, the input circuit IN-C is provided with the first monitor terminals V1 to Vn (n: an integer) and the second monitor terminals DV1 to DVn (n: an integer).

The first voltage measuring circuit 12a and the second voltage measuring circuit 12b are operated by the same clock for the purpose of perfectly synchronizing the operational timings of both voltage measuring circuits 12a, 12b.

For the first voltage measuring circuit 12a and the second voltage measuring circuit 12b, there are used circuits having the same characteristics.

The resistance values of the resistors R0 (R0-1 to R0-3) are selected so as to be extremely smaller than the resistance value of each of the resistors R1.

Consequently, the first monitor terminal Vn and the second monitor terminal DVn have similar time constants due to the external low pass filters (LPFs) each composed of the resistor R1 and the capacitor C1. Thus, by adjusting the time constant of each of the low pass filters, it is possible to suppress the voltage fluctuation.

In FIG. 1, reference symbols VH0 to VH3 denote detection lines for detecting respective voltages of the battery cells VBAT1 to VBAT3. There are provided (n+1) detection lines corresponding to the number (n) of battery cells VBAT.

The first voltage measuring circuit 12a measures, as the voltage in the first route, a voltage between the terminal VSS of the ground potential and the first monitor terminal V1 on the lowermost stage or a voltage between the respective first monitor terminals Vn. (V1-V2, V2-V3) of the upper and lower adjacent stages. The second voltage measuring circuit 12b measures, as the voltage in the second route, a voltage between the Terminal VSS of the ground potential and the second monitor terminal DV1 of the lowermost stage or a voltage between the first monitor terminal Vn (V1 or V2) and the second monitor terminal DVn+1 (DV2 or DV3) of the upper and lower adjacent stages.

As illustrated in FIG. 1, the voltage of the battery cell VBAT1 is detected as a potential between the ground potential VH0 and a positive potential VH1. The voltage of the battery cell VBA 2 is detected as a potential between the potential VH1 and a potential VH2. The voltage of the battery cell VBAT3 is detected as a potential between the potential VH2 and the potential VH3.

The situation where the FETn (FET1 to FET3) each constituting the equalization switch is controlled by the control unit 14 will be described below.

When the FET1 is turned off, the same voltage appears on the first monitor terminal V1 and the second monitor terminal DV1.

On the other hand, when the FET1 is turned on, a cell potential of the battery cell VBAT1 appears on the first monitor terminal V1, while a voltage (approximately VSS) obtained by subtracting a voltage drop generated at the resistor R0-n from the cell potential appears on the second monitor terminal DV1.

Similarly; when the FET2 is turned off, the same voltage appears on the first monitor terminal V2 and the second monitor terminal DV2. When the FET2 is turned on, a cell potential of the battery cell VBAT2 appears on the first monitor terminal V2, while a voltage (approximately V1) obtained by subtracting a voltage drop generated at the resistor R0-n from the cell potential appears on the second monitor terminal DV2.

When the FET3 is turned off, the same voltage appears on the first monitor terminal V3 and the second monitor terminal DV3. When the FET3 is turned on, a cell potential of the battery cell VBAT3 appears on the first monitor terminal V3, while a voltage (approximately V2) obtained by subtracting a voltage drop generated at the resistor R0-3 from the cell potential appears on the second monitor terminal DV3.

Under the control of the control unit 14, the multiplexer 11 selects these voltages and simultaneously inputs them to two voltage measuring circuits 12a, 12b.

More specifically, as for the voltage measurement of the battery cell VBAT1, the voltage between the first monitor terminal V1 and the terminal VSS is inputted to the first voltage measuring circuit 12a, while the voltage between the second monitor terminal DV1 and the terminal VSS is inputted to the second voltage measuring circuit 12b.

As for the voltage measurement of the battery cell VBAT2, the voltage between the first monitor terminals V2-V1 is inputted to the first voltage measuring circuit 12a, while the voltage between the second monitor terminal DV2 and the first monitor terminal V1 is inputted to the second voltage measuring circuit 12b.

As for the voltage measurement of the battery cell VBAT3, the voltage between the first monitor terminals V3-V2 is inputted to the first voltage measuring circuit 12a, while the voltage between the second monitor terminal DV3 and the first monitor terminal V2 is inputted to the second voltage measuring circuit 12b.

Then, these voltages are measured by the first voltage measuring circuit 12a and the second voltage measuring circuit 12b simultaneously. As the measurement accuracy can be confirmed since the comparator 13 comparing these voltages with each other, it is possible to detect the voltages of the respective battery cells VBAT1 to VBAT3 with high accuracy.

During the equalization process, the voltages of the first monitor terminal Vn and the second monitor terminal DVn do not coincide with each other. At this time, the comparison by the comparator 13 is not performed basically. Nevertheless, by the circuit of FIG. 1, it is possible to execute the self-diagnosis operation while performing the equalization. The reason of this is as follows: as the control of the FET for equalization and the voltage measurement are independently controllable, the self-diagnosis operation can be realized by making the switches in the first switch group 100 open while turning on the FET.

On the other hand, when performing self-diagnosis of the battery monitoring system S1, the control unit 14 performs the on and off control of the first switch group (SW1 group: SW1-1 to SW1-6) 100, the second switch group (SW2 group: SW2-1 to SW2-6) 101, and the third switch group (SW3 group: SW3-1 to SW3-3) 102, and the control of generating a voltage for the self-diagnosis.

Figure 2:
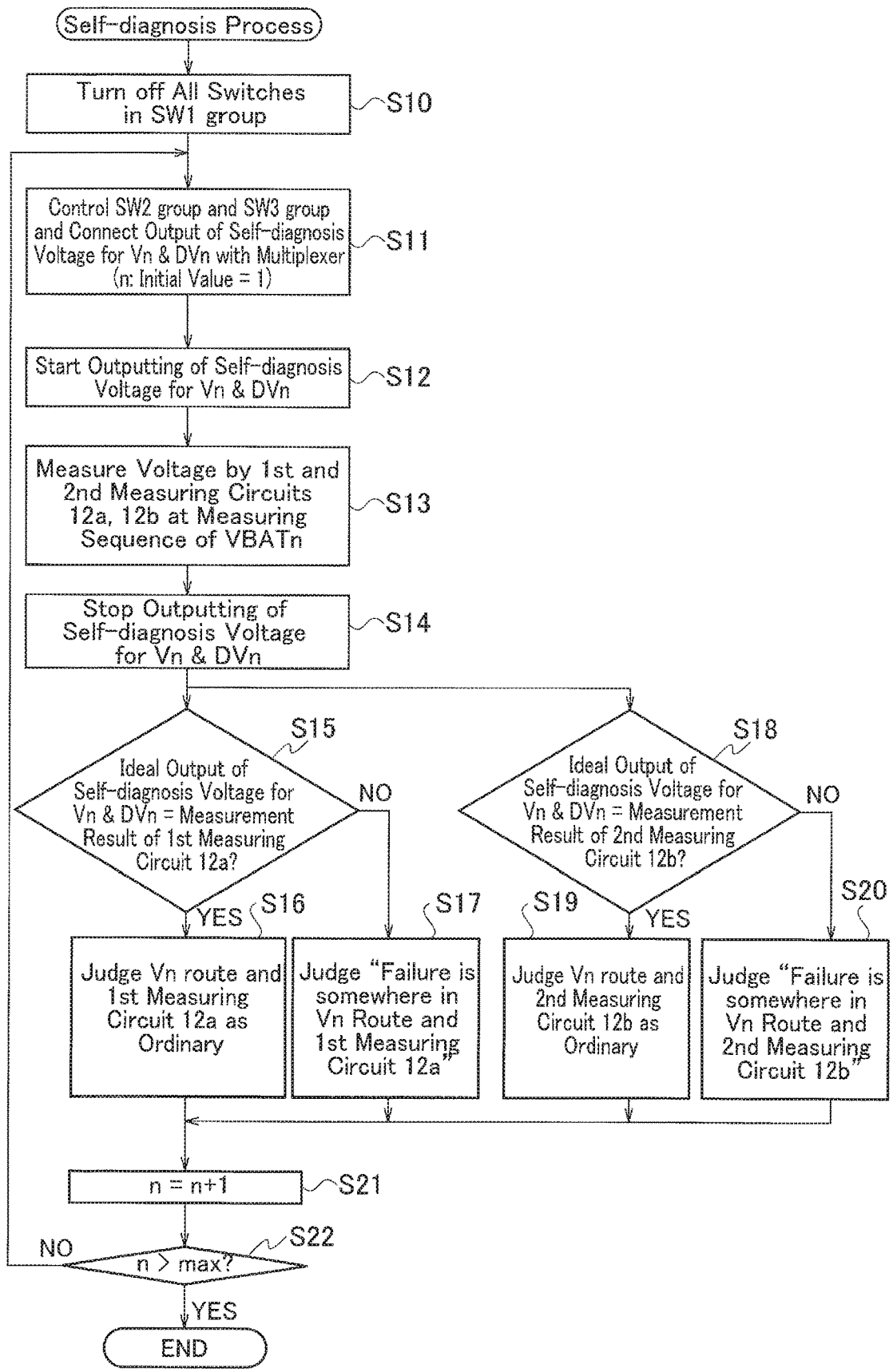
FIG. 2 is a flowchart illustrating the processing procedure of a battery monitoring process executed in the battery monitoring system according to the embodiment.
Figure 3:
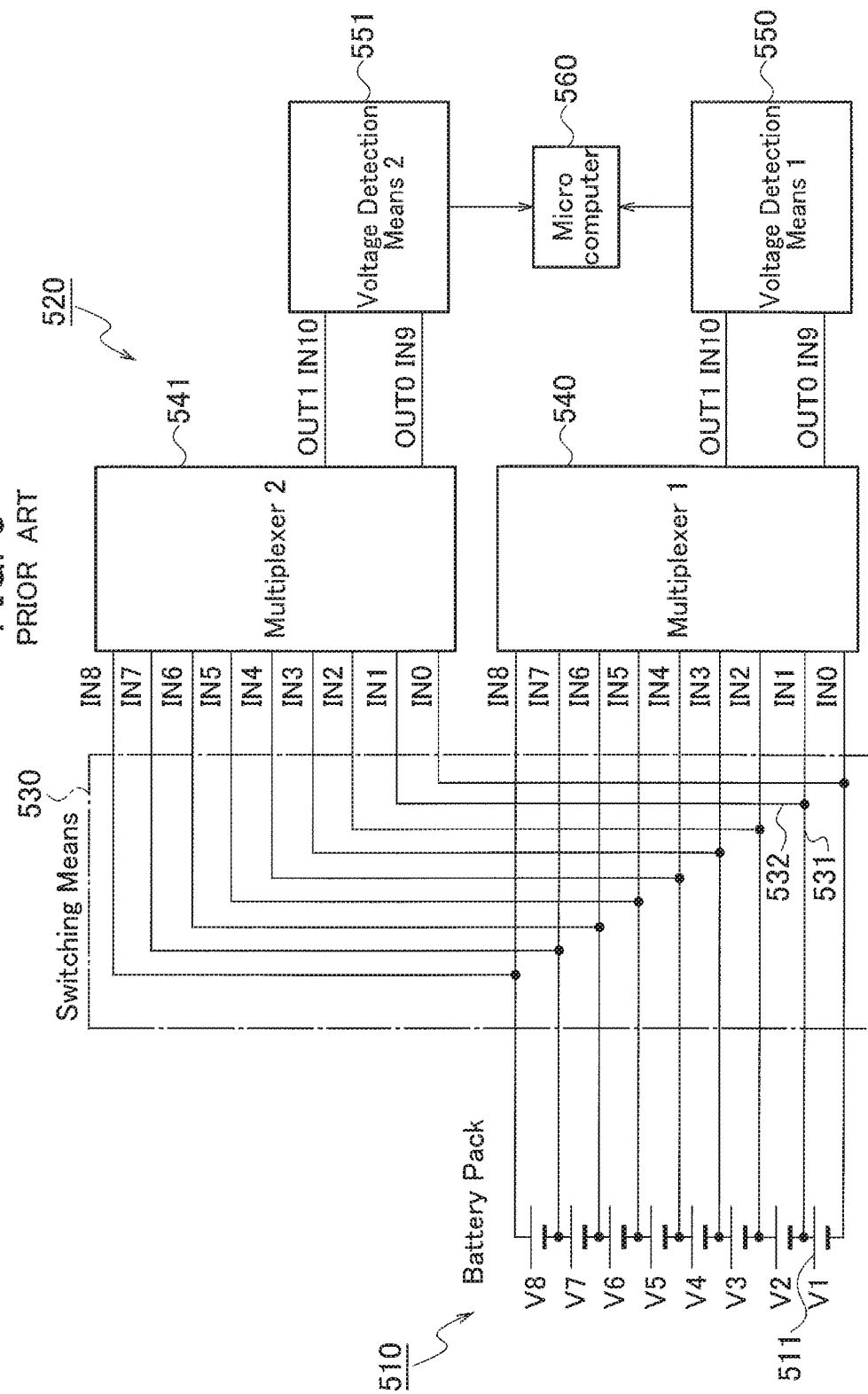
FIG. 3 is a circuit diagram illustrating an overall configuration of a voltage detection device of a conventional example.

More specifically, the control unit 14, which may be composed of a microcomputer or the like, performs the self-diagnosis processing operation illustrated in FIG. 2.

Here, the processing procedure of the self-diagnosis processing operation will be described with reference to the flowchart of FIG. 2.

When the self-diagnosis processing operation is started, it is executed at step S10 to turn off all the switches in the first switch group SW1 and thereafter, the process goes to step S11.

As a result, the connection between a system part, which is composed of the battery cells VBATn and the input circuit IN-C, and the other system parts can be cut off.

At step S11, by controlling the second switch group SW2 and the third switch group SW3 by the control unit 14, it is executed to connect an output of the self-diagnosis voltage for the first monitor terminal Vn and the second monitor terminal DVn to the input side of the multiplexer 11. The initial value of "n" is "1".

Here, the application of the self-diagnosis voltage will be described.

Specifically, the switch control is performed as follows.

1) When outputting the self-diagnosis voltage for the first monitor terminal V1 and the second monitor terminal DV1, it is executed to control the first switch group 100, the second switch group 101, and the third switch group 102 so that the same voltage is applied between the route of the first monitor terminal V1 and the terminal VSS and between the route of the second monitor terminal DV1 and the terminal VSS.

2) When outputting the self-diagnosis voltage for the first monitor terminal V2 and the second monitor terminal DV2, it is executed to control the first switch group 100, the second switch group 101, and the third switch group 102 so that the same voltage is applied between the route of the first monitor terminal V2 and the first monitor terminal V1 and between the route of the second monitor terminal DV2 and the first monitor terminal V1.

3) When outputting the self-diagnosis voltage for the first monitor terminal V3 and the second monitor terminal DV3, it is executed to control the first switch group 100, the second switch group 101, and the third switch group 102 so that the same voltage is applied between the route of the first monitor terminal V3 and the first monitor terminal V2 and between the route of the second monitor terminal DV3 and the first monitor terminal V2.

It is possible to carry out the outputting of the self-diagnosis voltage for the first monitor terminal V1 and the second monitor terminal DV1, the outputting of the self-diagnosis voltage for the first monitor terminal V2 and the second monitor terminal DV2, and the outputting of the self-diagnosis voltage for the first monitor terminal V3 and the second monitor terminal DV3 simultaneously or independently. The flowchart of FIG. 2 illustrates an example of executing such an independent outputting continuously.

Returning to the flowchart of FIG. 2, at step S12, it is executed to start the outputting of the self-diagnosis voltage for the first monitor terminal Vn and the second monitor terminal DVn and thereafter, the process goes to step S13.

At step S13, the voltage measurement is carried out by the first voltage measuring circuit 12a and the second voltage measuring circuit 12b in the same process (sequence) as the measurement of the battery cell VBATn and thereafter, the process goes to step S14.

At step S14, it is executed to stop the outputting of the self-diagnosis voltage for the first monitor terminal Vn and the second monitor terminal DVn and thereafter, the process goes to step S15 and step S18.

First, at step S15, it is judged whether or not "the ideal output value of the self-diagnosis voltage for the first monitor terminal Vn and the second monitor terminal DVn"="the measurement result of the first voltage measuring circuit 12a".

Here, "the ideal output value of the self-diagnosis voltage for the first monitor terminal Vn and the second monitor terminal DVn" means a voltage value guaranteed within a predetermined range (e.g. 10 mV) for each diagnosis voltage output of the self-diagnosis voltage generation circuit 15.

If the judgment at step S15 is "Yes", the process goes to step S16 where it is judged that the route of the first monitor terminal Vn and the first voltage measuring circuit 12a are in an ordinary state and then, the process goes to step S21.

If the judgment at step S15 is "No", the process goes to step S17 where it is judged that a failure is somewhere in the route of the first monitor terminal Vn and the first voltage measuring circuit 12a and thereafter, the process goes to step S21.

On the other hand, at step S18, it is judged whether or not "the ideal output value of the self-diagnosis voltage for the first monitor terminal Vn and the second monitor terminal DVn"="the measurement result of the second voltage measuring circuit 12b". If the judgement at this step is "Yes", the process goes to step S19.

At step S19, it is judged that the route of the second monitor terminal DVn and the second voltage measuring circuit 12b are in an ordinary state, and thereafter, the process goes to step S21.

If the judgment at step S18 is "No", the process goes to step S20 where it is judged that a failure is somewhere in the route of the second monitor terminal DVn and the second voltage measuring circuit 12b and thereafter, the process goes to step S21.

At step S21, it is executed to increment "n" by "1" and then, the process goes to step S22.

At step S22, it is judged whether or not the inequality relationship of "n>max" is satisfied. If the judgement at step S22 is "Yes", then the process is ended. On the contrary, if the judgement at step S22 is "No", the process returns to step S11 and thereafter, the above-mentioned processes will be executed repeatedly.

The above description relates to a case where there are three self-diagnosis targets and the self-diagnosis operation is executed for these targets continuously. However, the self-diagnosis operation may be executed for a selected target independently.

With the above-mentioned self-diagnosis operation, it is possible to confirm an error amount generated in each route by the self-diagnosis voltage (guarantee of accuracy) and also possible to judge a failure if the error amount exceeds a predetermined threshold value for judgment. As a result, it is possible to improve the functional safety of the entire system.

Additionally, it is also possible to continue the function, such as voltage measurement of the battery cell VBATn, by using only the ordinary route whose accuracy has been guaranteed by the self-diagnosis operation.

With the self-diagnosis operation, furthermore, as two routes are simultaneously diagnosed using the same measurement processing (sequence) as the cell voltage measurement, by the same self-diagnosis voltage, it is also possible to confirm the certainty of the first voltage measuring circuit 12a and the second voltage measuring circuit 12b as well as the certainty of the measurement process (sequence) (e.g. the presence/absence of a bug in the measurement program).

As for an operation check of the multiplexer 11, it is possible to perform the connection checking by setting the self-diagnosis voltage to a value unique to the channel according to the number of channels to be switched.

In the conventional example, if failures occur in two measurement routes, the failures could not be detected. However, in order to solve this problem, the battery monitoring system of the present application is configured so as to confirm two measurement routes and their functions using the self-diagnosis operation at arbitrary timing, thereby assuring the certainty of the cell voltage measurement function.

In view of securing the detection accuracy of a failure or the like, additionally, it is preferable that the battery monitoring system according to the embodiment is constructed by a single LSI.

Although the battery monitoring system of the present application has been described based on the illustrated embodiment, the present application is not limited to this and therefore, the constitution of respective components may be replaced with an arbitrary configuration having the same function.

For instance, instead of using the multiplexer 11, the self-diagnosis voltages may be directly applied to the first voltage measuring circuit 12a and the second voltage measuring circuit 12b for the self-diagnosis operation. In such a case, the multiplexer 11 may be self-diagnosed by another diagnosis means.

Although the third switch group (SW3 group) 100 is provided in the embodiment, it may be eliminated because of its nonessential component.

What is claimed is:

1. A battery monitoring system for monitoring a state of a battery pack including n (n: an integer) pieces of battery cells connected in series over a plurality of stages, comprising:
   an input circuit to which respective voltage signals of the battery cells are inputted;
   a multiplexer configured to:
     select a battery cell for voltage detection from the n pieces of battery cells;
     select voltage signals inputted from the input circuit; and
     output the selected voltage signals;
   a self-diagnosis voltage generation circuit configured to generate a self-diagnosis voltage for diagnosing a failure status of the battery monitoring system itself;
   a first voltage measuring circuit configured to measure a voltage signal in a first route inputted through the multiplexer, based on the self-diagnosis voltage generated from the self-diagnosis voltage generation circuit or based on the voltages of the battery cells inputted from the input circuit;
   a second voltage measuring circuit configured to measure a voltage signal in a second route inputted through the multiplexer at the same time when the first voltage measuring circuit measures the voltage signal in the first route, based on the self-diagnosis voltage generated from the self-diagnosis voltage generation circuit or based on the voltages of the battery cells inputted from the input circuit;
   a comparator configured to compare a measurement result by the first voltage measuring circuit with a measurement result by the second voltage measuring circuit; and
   a control unit configured to:
     judge a presence or absence of a failure in a measuring route connected to the first voltage measuring circuit or the second voltage measuring circuit and a failure of the first voltage measuring circuit itself or the second voltage measuring circuit itself, based on a comparison result by the comparator; and
     control the input circuit, the multiplexer, the comparator, and the self-diagnosis voltage generation circuit,
   wherein the input circuit comprises:
     n pieces of FETs constituting equalization switches for equalizing the voltages of the respective battery cells;
     n nieces of resistors for equalization, each of which is connected between a drain terminal side of each of the FETs and a positive side of each of the battery cells;
     n pieces of first monitor terminals, each of which is connected to a first connection point between each of the resistors and the positive side of each of the battery cells and to which the voltage signals in the first route are inputted;
     n pieces of second monitor terminals, each of which is connected to a second connection point between the drain terminal side of each of the FETs and each of the resistors and to which the voltage signals in the second route are inputted; and
     low pass filters respectively connected between each of the first monitor terminals and a corresponding first connection point and between each of the second monitor terminals and a corresponding second connection point, each having a same time constant, and
   a first switch group is interposed between the input circuit and the multiplexor to shut-off the voltages of the battery cells inputted from the input circuit when selectively connecting the self-diagnosis voltage generation circuit with the routes of the first monitor terminals and the routes of the second monitor terminals.

2. The battery monitoring system of claim 1, wherein the self-diagnosis voltage generation circuit comprises a self-diagnosis voltage output unit configured to output one of different self-diagnosis voltages with every stages, to the route of the first monitor terminal and the route of the second monitor terminal both belonging to the same stage.

3. The battery monitoring system of claim 1, wherein a second switch group is interposed between the self-diagnosis voltage generation circuit and the first switch group, and
the second switch group is configured to apply the self-diagnosis voltage generated by the self-diagnosis voltage generation circuit to the first voltage measuring circuit or the second voltage measuring circuit selectively.

4. The battery monitoring system of claim 3, wherein a third switch group is interposed between the self-diagnosis voltage generation circuit and the second switch group, and
the third switch group is configured to cut off an application of the self-diagnosis voltage generated by the self-diagnosis voltage generation circuit forcibly.

5. The battery monitoring system of claim 1, wherein the control unit is further configured to:
   compare a measurement result of the first voltage measuring circuit and the self-diagnosis voltage; and
   determine the presence or absence of the failure in the first voltage measuring circuit based on comparing the measurement result of the first voltage measuring circuit and the self-diagnosis voltage.

6. The battery monitoring system of claim 5, wherein the control unit is further configured to:
   compare a measurement result of the second voltage measuring circuit and the self-diagnosis voltage; and
   determine the presence or absence of the failure in the second voltage measuring circuit itself based on comparing the measurement result of the second voltage measuring circuit and the self-diagnosis voltage.

* * * * *